United States Patent [19]
Kobayashi et al.

[11] Patent Number: 5,944,968
[45] Date of Patent: Aug. 31, 1999

[54] SPUTTERING APPARATUS

[75] Inventors: Masahiko Kobayashi, Kanagawa; Masahito Ishihara; Hajime Sahase, both of Fuchu; Nobuyuki Takahashi, Sagamihara, all of Japan

[73] Assignee: Anelva Corporation, Tokyo, Japan

[21] Appl. No.: 08/931,651

[22] Filed: Sep. 16, 1997

[30] Foreign Application Priority Data

Sep. 18, 1996 [JP] Japan ................................. 8-269433

[51] Int. Cl.6 ................................................ C23C 14/34
[52] U.S. Cl. ................................. 204/298.2; 204/298.19
[58] Field of Search ........................ 204/298.16, 298.17, 204/298.18, 298.19, 298.2

[56] References Cited

U.S. PATENT DOCUMENTS

| | | | |
|---|---|---|---|
| 4,714,536 | 12/1987 | Freeman et al. | 204/298.2 |
| 4,902,931 | 2/1990 | Veltrop et al. | 204/298.2 |
| 5,188,717 | 2/1993 | Broadbent et al. | 204/298.2 |
| 5,514,257 | 5/1996 | Kobayashi et al. | 204/192.17 |
| 5,643,427 | 7/1997 | Kobayashi et al. | 204/298.2 |

FOREIGN PATENT DOCUMENTS 2-122073  5/1990  Japan.

*Primary Examiner*—Nam Nguyen
*Assistant Examiner*—Rodney G. McDonald
*Attorney, Agent, or Firm*—Armstrong, Westerman, Hattori, McLeland and Naughton

[57] ABSTRACT

A sputtering apparatus is provided with a magnetic assembly which is rotated and revolved, and the eccentric distance between the rotation axis and the revolution axis is varied. By this arrangement, erosion profile of a target is made uniform, whereby a uniform thin film is deposited on a substrate surface.

5 Claims, 6 Drawing Sheets

SPUTTERING APPARATUS

BACKGROUND OF THE INVENTION

1. Field of the Invention

The invention relates to a sputtering apparatus for depositing a thin film on a substrate surface.

2. Description of the Prior Art

Fin-film deposition on a substrate surface is widely carried out in fabrications of electronic devices such as large-scale integrated circuits (LSI) and liquid crystal displays (LCD). Because of high deposition rates, sputtering apparatuses are often utilized in this thin-film deposition.

FIG. 6 shows a schematic front view of a conventional sputtering apparatus. The sputtering apparatus shown in FIG. 6 comprises a vacuum chamber 1 having a pumping system 11, a cathode 2 provided in vacuum chamber 1, a target 2 which is a component of cathode 2 and is sputtered for deposition, a substrate holder 3 for placing a substrate 30 so as to face to cathode 2 in chamber 1, and gas introduction system 6 for introducing a gas necessary for sputter discharge (hereafter called "discharge gas") into chamber 1. The apparatus shown in FIG. 6 is a magnetron sputtering type. Specifically, cathode 2 is composed mainly of a magnetic assembly 4 and a target 5 provided at the front side of magnetic assembly 4.

The apparatus shown in FIG. 6 is operated as follows. After pumping vacuum chamber 1 by pumping system 11 to a certain pressure, a discharge gas such as argon is introduced by gas introduction system 6. Introducing the discharge gas, a negative direct current (dc) voltage is applied with cathode 2. Sputter discharge is ignited and sustained with the discharge gas, and thereby target 5 is sputtered. Sputtered material of target 5 arrives at substrate 30 to deposit a thin film on the surface of substrate 30.

In sputtering apparatuses as described, a thin film is sometimes deposited overlying on another dissimilar thin. For example, a barrier film is deposited by sputtering for preventing cross-diffusion between a contact wiring layer and an underlayer. A multilayer structure where a titanium nitride film is overlaid on a titanium film is employed for this barrier film.

Process of such dissimilar-films deposition will be described taking the barrier film into an example. In composition of the apparatus shown in FIG. 6, target 2 is made of titanium. First of all, target 2 is sputtered introducing a normal discharge gas such as argon by gas introduction system 6. As a result, titanium film is deposited on substrate 30. Next, nitrogen gas is introduced by an auxiliary gas introduction system 7 connected with gas introduction system 6. Target 2 is sputtered through the sputtering discharge of nitrogen gas. As a result, titanium nitride film is deposited on the nitride film, utilizing reaction of titanium and nitrogen. The structure where the titanium nitride film is overlaid on the titanium film is obtained.

In the process of such dissimilar-films deposition as described, there are problems such as deposition non-uniformity brought by diversity of erosion profiles across a target depending on kinds of discharge gases and precipitation of reaction product on the target surface of a shallowly eroded area. These problems will be described using FIG. 7. FIG. 7 is schematic cross-sectional view for describing problems in conventional sputtering apparatuses.

A cathode configuration and an erosion profile in conventional sputtering apparatuses are shown in FIG. 7. A magnetic assembly 4 is mainly composed of a center magnet 41, an outer magnet 42 surrounding center magnet 41 and yoke 43 interconnecting center magnet 41 and outer magnet 42. As shown in FIG. 7, poles of center magnet 41 and outer magnet 42 at those front surface are different from each other. This is why arch-shaped magnetic lines penetrating through target 5 provided in front of magnetic assembly 4 are applied.

In magnetron discharge, as known, discharge is most intense where directions of electric field and magnetic field make rectangular. In the sputtering apparatus shown in FIG. 6 and FIG. 7, the discharge is most intense at peaks of arch-shaped magnetic lines or near, because the electric field is applied along the thickness direction of target 5. Therefore, generally target 5 is eroded deeply at the region facing to the peaks of magnetic lines and shallowly at center and peripheral regions.

When material of target 5 is titanium and nitrogen gas is introduced into vacuum chamber 1, titanium and nitrogen react at the surface of target 5, inner space of vacuum chamber 1 where sputtered titanium atoms fly, or the surface of substrate 30 which titanium atoms are sticking on. Precipitating titanium nitride dose not remain much in the surface region where target 5 is eroded deeply because precipitating titanium nitride is sputtered out of the surface efficiently. Contrarily, as designated with "500" in FIG. 7, precipitating titanium nitride remains at the surface region where target 5 is eroded shallowly because precipitating titanium nitride 500 is not sputtered out.

Because sticking force of this precipitating titanium nitride with target 5 is week, titanium nitride tends to exfoliate easily when it grows to some amount. When titanium nitride 500 exfoliates, fractions of titanium nitride 500 fly in vacuum chamber 1 to become dust particles. If those particles arrive at the surface of substrate 30, problems such as a local film-thickness defect and film contamination arise. To solve these problems resulting from the exfoliation of precipitating titanium nitride, sputter-cleaning cleaning is carried out during an interval between the titanium nitride depositions. The sputter cleaning is carried out by sputtering the precipitating titanium nitride out of the target surface introducing such an normal discharge gas as argon. Because with conventional sputtering apparatuses this sputter-cleaning needs to be carried out much often, production efficiency of those apparatuses is worsen causing productivity decrease.

When sputtering is carried out switching to a dissimilar gas as in case that titanium film and titanium nitride film are deposited using common target 5, a problem such as deposition non-uniformity arises resulting from that erosion profiles differ depending on kinds of introduced gases. For example, because argon and nitrogen have a different ionization coefficient and a different sputter efficiency, the eorosion profiles differ a little even if the same magnetic assembly 4 is used. In addition, plasma density distributions also differ a little depending on kinds of discharge gases. From these factors, the erosion profiles differs between in case introducing argon and in case introducing nitrogen.

To make an erosion profile uniform, conventional apparatuses revolve magnetic assembly 4 eccentrically from the axis of target 5. However, even by this method, an erosion profile is made uniform only in case introducing a specific gas. This is because the eccentric revolution of magnetic assembly 4 is just composed so that erosion can be made uniform simulating introduction of a specific discharge gas. In other words, because magnetic assembly 4 is composed so that an erosion profile is made uniform when a specific discharge gas is introduced, another erosion profile is not made uniform when another discharge gas is used, which leads to the non-uniform deposition on the surface of substrate 30. It is supposed that this problem can be solved by replacing magnetic assembly 4 according to discharge gases. However, replacement of magnetic assembly 4 costs so much and makes the structure of the apparatus so complicated.

SUMMARY OF THE INVENTION

The object of the present invention is to solve those problems described above. Specifically, the object of the present invention is to provide a sputtering apparatus where erosion profile of a target is uniform if any kind of discharge gas is used and an uniform thin film is deposited on a substrate surface obtaining the uniform erosion.

To achieve this object, this invention provides a sputtering apparatus where a magnetic assembly is rotated and revolved, and the eccentric distance between the rotation axis and the revolution axis is varied.

PREFERRED MODES OF THE INVENTION

Figure 1:
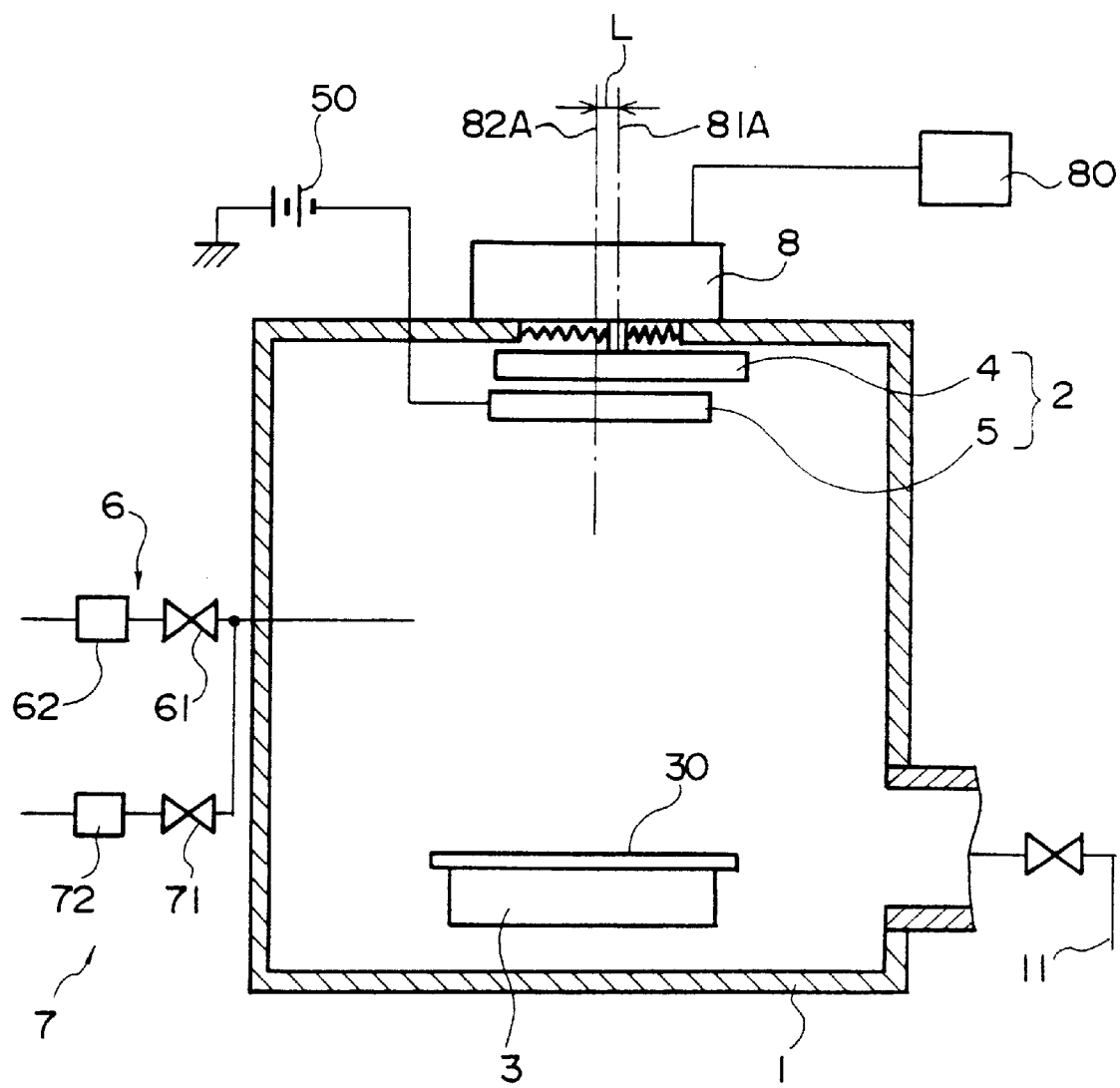
FIG. 1 is a schematic front view of a sputtering apparatus of the mode of the invention.

Preferred modes of the invention will be described as follows. FIG. 1 is a schematic front view of a sputtering apparatus of the mode of the invention. The sputtering apparatus shown in FIG. 1 comprises a vacuum chamber 1 having a pumping system 11, a cathode 2 provided in vacuum chamber 1, a target 2 which is a component of cathode 2 and is sputtered for deposition, a substrate holder 3 for placing a substrate 30 so as to face to cathode 2 in chamber 1 and gas introduction system 6 for introducing a discharge gas into chamber 1.

Vacuum chamber 1 is an air-tight vessel having a gate-valve (not shown). Pumping system 11 is composed so as to pump vacuum chamber 1 to order of $10^{-6}$ Pa, comprising a mechanical-sealed pump and a diffusion pump. Cathode 2 is composed mainly of magnetic assembly 4 for a magnetron discharge and target 5 provided in front of magnetic assembly 4. Magnetic assembly 4 is rotated and revolved by rotation revolution system 8.

Figure 2:
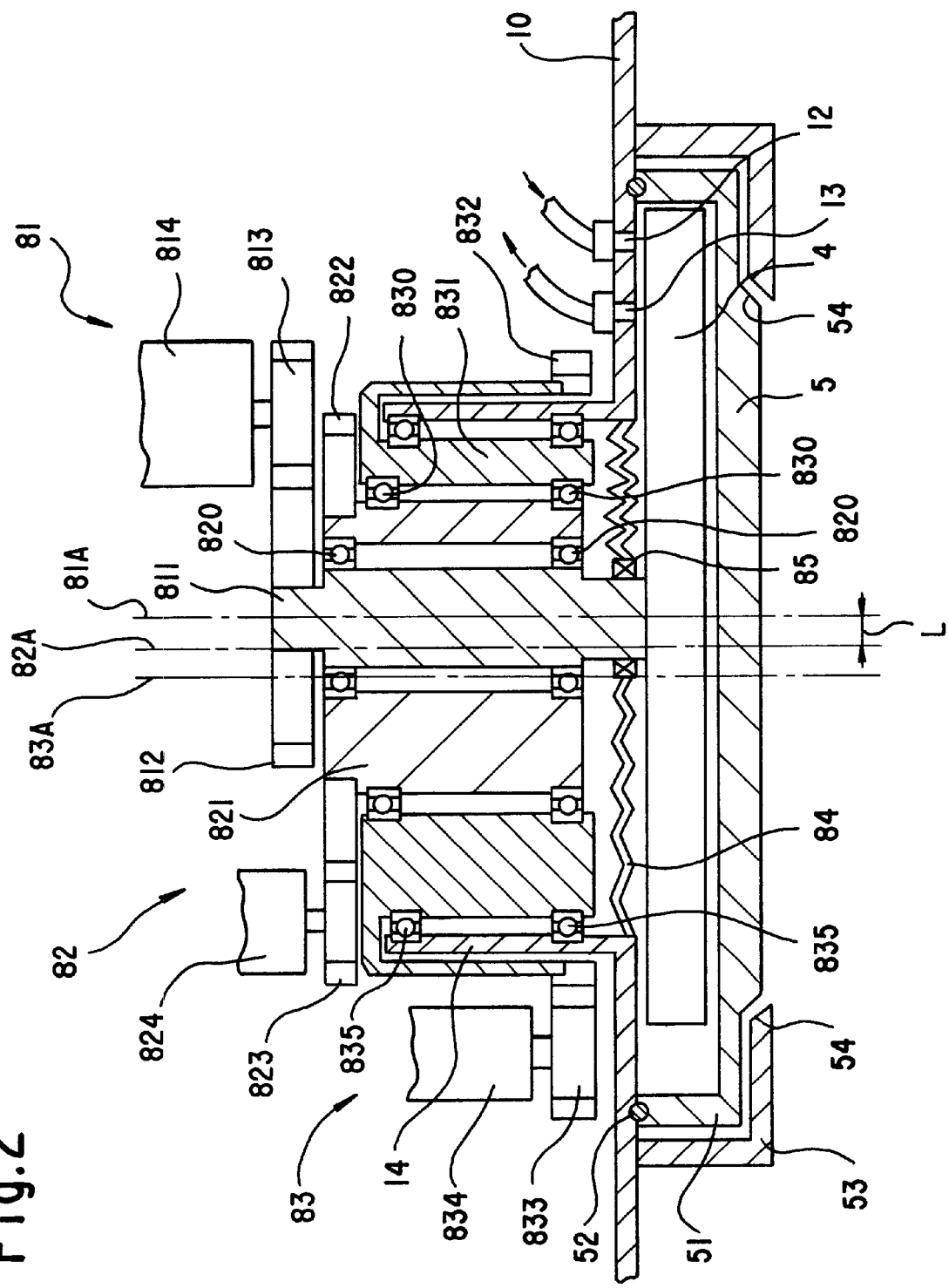
FIG. 2 is a schematic sectional front view of rotation revolution system 8 in the apparatus shown in FIG. 1.

Detailed composition of rotation revolution system 8 will be described using FIG. 2. FIG. 2 is a schematic sectional front view of rotation revolution system 8 in the apparatus shown in FIG. 1. As shown in FIG. 2, rotation revolution system 8 is composed mainly of a rotation means 81 for rotating magnetic assembly 4 around rotation axis 81A, which is the center axis of magnetic assembly 4, a revolution means 82 for revolving magnetic assembly 4 around a revolution axis 82A which corresponds to the center axis of target 5, an eccentric-distance varying mechanism 83 for varying the eccentric-distance between rotation axis 81A and revolution axis 82A.

First of all, composition of rotation means 81 is described. Rotation means 81 is composed mainly of holder rod 811 fixed at the backside of magnetic assembly 4, the first rotation gear 812 fixed at an end of holder rod 811, the second rotation gear 813 engaging the first rotation gear 812, and rotation driving source 814 such as motor for rotating the second rotation 813. As shown in FIG. 2, holder rod 811 is fixed at the backside of magnetic assembly 4 so that rotation axis 81A corresponds to the center axis of magnetic assembly 4. When rotation driving source 81 is operated, holder rod 811 is rotated through the first and second rotation gear 812,813, resulting in that magnetic assembly 4 is rotated in a body.

Next will be described revolution means 82. Revolution means 82 is composed mainly of revolution bushing 821 through which holder rod 811 is inserted, the first gear 822 provided at an end of revolution bushing 821, the second revolution gear 823 engaging the first revolution gear 822, and revolution driving source 824 connected with the second revolution gear 823. Revolution bushing 821 has cylindrical inner space which diameter is a little wider than holder rod 811. Holder rod 811 is inserted through this inner space. A couple of (upper and lower) bearings 820 are provided between revolution bushing 821 and holder rod 811. When revolution driving source 824 is operated, revolution bushing 821 is rotated through the first and second revolution gear 822,823. Rotated revolution bushing 821 revolves holder rod 811, the first rotation gear 812 and the second rotation gear 813 in a body around revolution axis 82A. This results in that magnetic assembly 4 is revolved around revolution axis 82A.

Next will be described eccentric-distance varying (EDV) means 83. EDV mechanism 83 in this mode is composed so that the eccentric distance can be varied by rotating rotation means 81 and revolution means 82 in a body around an axis 83A which is different from revolution axis 82A (this axis 83A is called "EDV axis" hereafter). Specifically, EDV mechanism 83 is composed mainly of EDV bushing 831 through which revolution bushing 821 is inserted, the first EDV gear 832 fixed at the outer surface of EDV bushing 831, the second EDV gear 833 engaging the first EDV gear 832, and EDV driving source 834 connected with the second EDV gear 833.

EDV bushing 831 has the cylindrical inner space which diameter is a little wider than the outer diameter of revolution bushing 821. Revolution bushing 821 is inserted through this inner space. As shown in FIG. 2, a couple of (upper and lower) bearings 835 are provided between EDV bushing 831 and revolution bushing 821.

Also as shown in FIG. 2, mounting ring 14 is provided uprightly on wall 10 of vacuum chamber 1 at the place where rotation revolution system 8 is mounted. A circular groove in which mounting ring 14 is inserted is formed at the periphery of EDV bushing 831. Both this circular groove and mounting ring 14 have a cylindrical shape which center is at EDV axis 83A. The width of the circular groove is a little wider than the thickness of mounting ring 14. A couple of (upper and lower) bearing 835 are provided between the inner surface of mounting ring 14 and the inner wall of the circular groove.

In the structure described above, EDV bushing 831 is held by mounting ring 14 through bearings 835. When EDV driving source 834 is operated, EDV bushing 831 is rotated through the second EDV gear 833 and the first EDV gear 832, resulting in that rotation means 81 and revolution means 82 are revolved around EDV axis 83A in a body. Because EDV axis 83A is different from evolution axis 82A, rotation axis 81A and revolution axis 82A are both revolved around EDV axis 83A. In this motion, when the rotation speed on rotation means 81 and the revolution speed on revolution means 82 are chosen adequately, relationship of rotation axis 81A and revolution axis 82A transforms periodically. In other words, varying the eccentric distance is enabled.

Rotation revolution system 8 as described is provided outside vacuum chamber 1, i.e., at atmosphere pressure. Inside mounting ring 14, an opening is formed with wall 10 of vacuum chamber 1. An elastic blade 84 is provided so as to shut this opening air-tightly. Holder rod 811 penetrates elastic blade 84. A magnetic fluid seal 85 is provided between elastic blade 84 and holder rod 811 so as to seal the in-between space with allowing holder rod 811 to be rotated. An typical example of elastic blade 84 is a bellows.

Target 5 in this mode is a cup-like shape having a sleeve 51 in which magnetic assembly 4 is provided. The margin of sleeve 51 is fixed air-tightly with wall 10 of vacuum chamber 1. At the fixing part of sleeve 51, seal 52 such as O-ring is provided. Inlet 12 and outlet 13 of cooling water are formed on wall 10 which target 5 is mounted with. Therefore, it is possible to cool target 5 and magnetic assembly 4 by circulating cooling water through the inner space of target 5.

Surrounding target 5, shield 53 which is L-shaped in cross-section and ring-shaped as a whole is provided. The inner edge of shield 53 is tapered as shown in FIG. 2. A slope facing to this tapered edge of shield 53 is formed at the front surface of target 5. Shield 53 is for restraining plasma from diffusing to an unnecessary surface region of target 5 and is connected with grounded wall 10 of vacuum chamber 1 to be maintained at the earth-potential. Therefore, the discharge is formed on the surface region inner than slope 54.

Using FIG. 1 again, other components of the sputtering apparatus of this mode will be described. The sputtering apparatus of this mode comprises gas introduction system 6 for introducing a discharge gas and auxiliary gas introduction system 7 for introducing a auxiliary discharge gas. Gas introduction system 6 introduces a normal discharge gas having a high sputter efficiency such as argon. Gas introduction system 6 is composed of valve 61 and gas flow controller 62 provided on an introduction pipe connected with a gas bomb (not shown) , and other components. Auxiliary gas introduction system 7 is, as well, composed of valve 71 and gas flow controller 72 provided on a pipe connected with a bomb (not shown), and other components.

Rotation revolution system 8 having described mechanisms comprises control unit 80. Control unit 80 is composed of an input device through which control commands for controlling each mechanism of rotation revolution system 8 are inputted, a computer for calculating operations of each mechanism according to inputted control commands, and other components.

Target 5 comprises target power supply 50. Target power supply 50 is usually a negative dc source applying a negative dc voltage with target 5. RF (radio frequency) power source is sometimes employed in sputtering of a dielectric target.

Operation of the sputtering apparatus of this mode with the above composition will be described as follows. In following description, sputter deposition of a barrier film is taken as an example as well as in the section of the prior art description. Therefore, material of target 5 is titanium.

First of all, opening the gate-valve provided with vacuum chamber 1, substrate 30 is transferred into vacuum chamber 1 and placed on substrate holder 3. Vacuum chamber 1 is pumped by pumping system 11 to about $10^{-6}$ Torr in advance. And, gas introduction system 6 is operated. Gas introduction system 6 introduces argon gas as a discharge gas at flow rate of, for example, about 20 SCCM (standard cubic centimeter per second) into vacuum chamber 1. Maintaining this flow rate, cathode 2 is operated. Specifically, rotation revolution system 8 provided with magnetic assembly 4 is operated to rotate and revolve magnetic assembly 4 and a negative dc voltage is applied with target 5 by target power supply 50 to ignite and sustain a sputter discharge. This dc negative voltage is, for example, −500 V. Through this sputter discharge, target 5 is sputtered, depositing titanium film on the surface of substrate 30. In this operation for the titanium film deposition, control unit 50 sends control commands to rotation revolution system 8 so that rotation revolution system 8 can give magnetic assembly 4 the optimum rotation revolution motion for the uniform erosion on target 5.

Next, valve 61 of gas introduction system 6 is closed and valve 7 of auxiliary gas introduction system 7 is opened. Auxiliary gas introduction system 7 introduces nitrogen gas at flow rate of, for example, about 20 SCCM. Maintaining this flow rate, cathode 2 is operated again. Rotating and revolving magnetic assembly 4 by rotation revolution system 8, target 5 is sputtered through the sputter discharge ignited and sustained by sputter power supply 50. This results in that titanium nitride film is deposited on the deposited nitride film. In this operation for the titanium nitride film deposition, control unit 50 sends control commands so that rotation revolution system 8 can give magnetic assembly 4 a rotation revolution motion different from that during the titanium film deposition introducing nitrogen gas. The erosion profile is effectively changed from that during the titanium film deposition, because magnetic assembly 4 performs a rotation revolution motion different from that during titanium film deposition by rotation revolution system 8 under control of control unit 80. After such a titanium nitrogen film deposition, operations of cathode 2 and auxiliary gas introduction system 7 are stopped. And, substrate 30 is transferred out of vacuum chamber 1.

Figure 3:
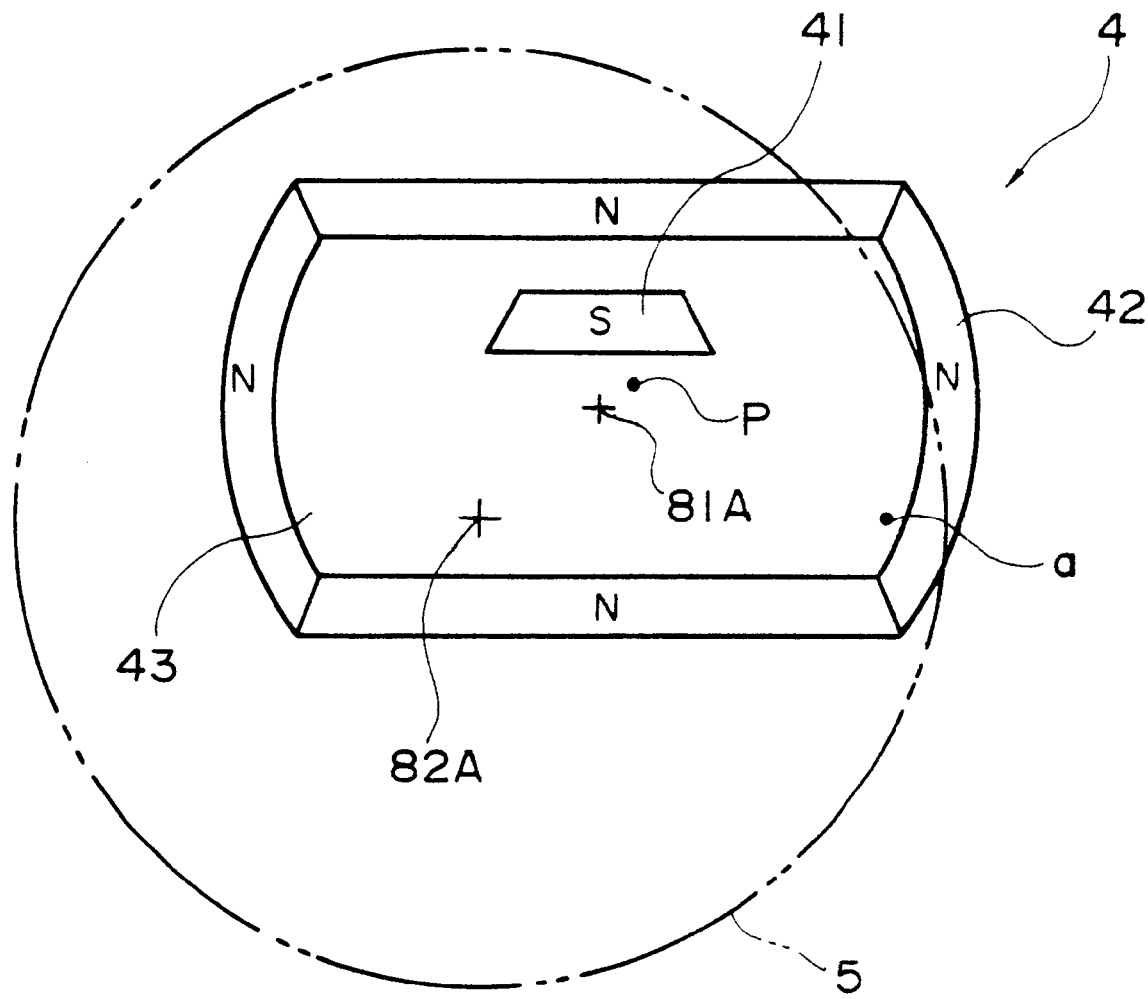
FIG. 3 is a detailed plane view of magnetic assembly 4 adopted in the sputtering apparatus shown in FIG. 1 and FIG. 2.
Figure 4A:
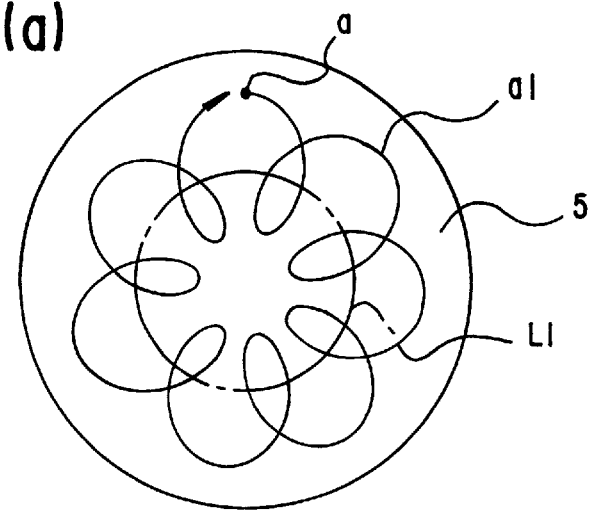
FIG. 4(a)–(c) schematically shows loci of point "a" on magnetic assembly 4 when magnetic assembly 4 is rotated and revolved.
Figure 4B:
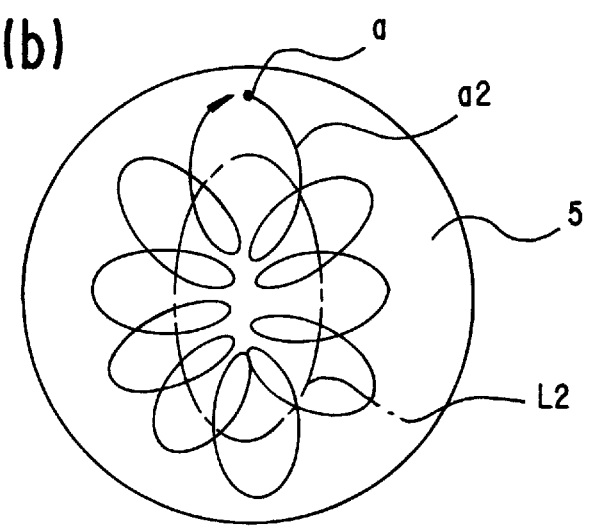
Figure 4C:
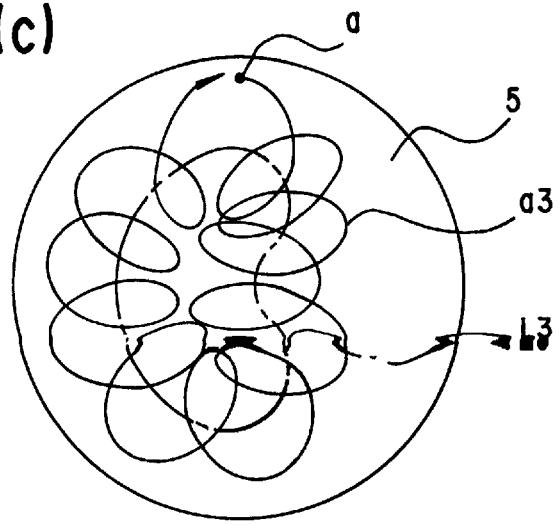
Figure 5A:
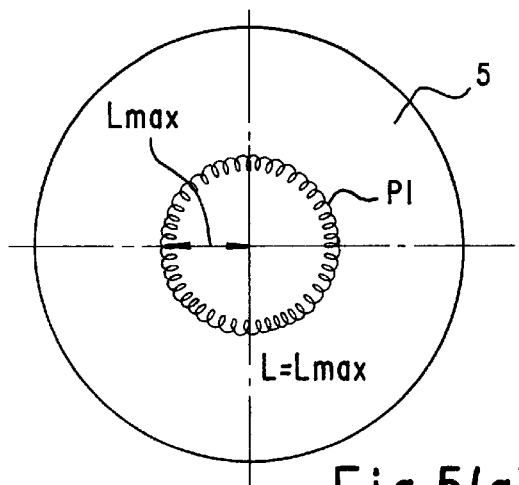
FIG. 5(a)–(e) schematically shows loci of point "p" on the magnetic assembly 4 when magnetic assembly 4 is rotated and revolved.
Figure 5B:
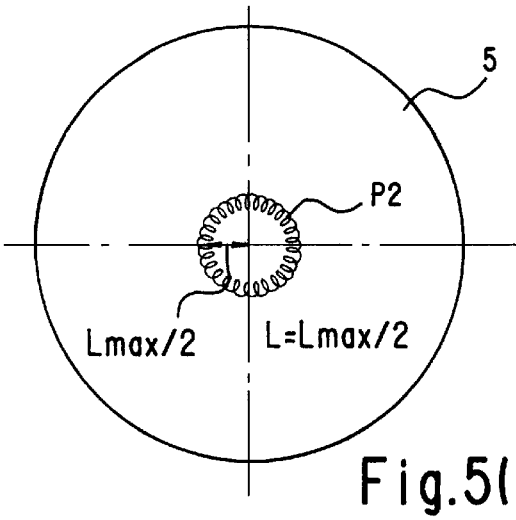
Figure 5C:
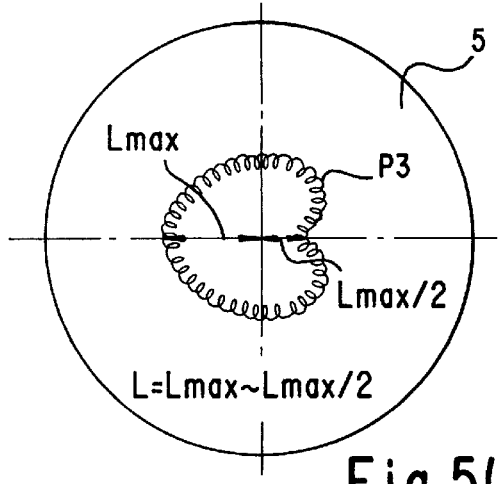
Figure 5D:
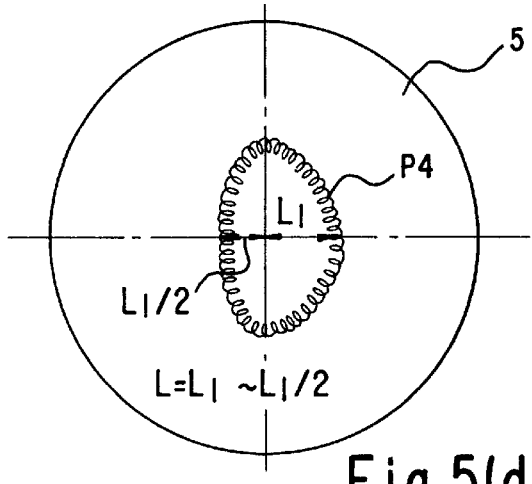
Figure 5E:
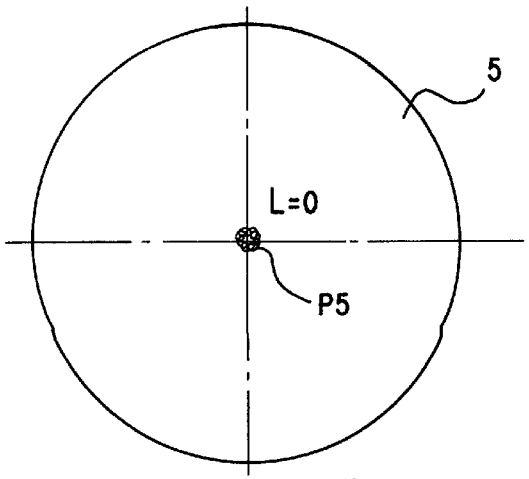
Figure 6:
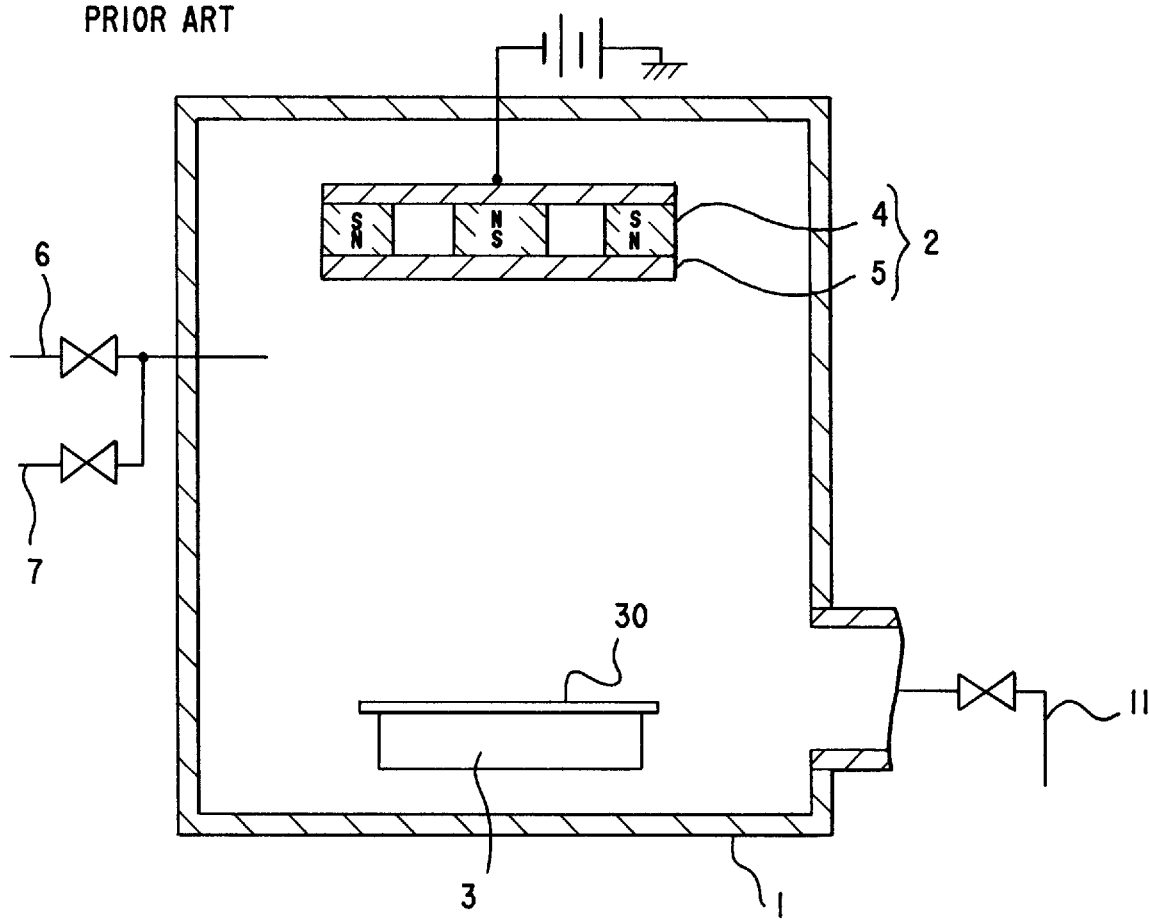
FIG. 6 is a schematic front view of a conventional sputtering apparatus.
Figure 7:
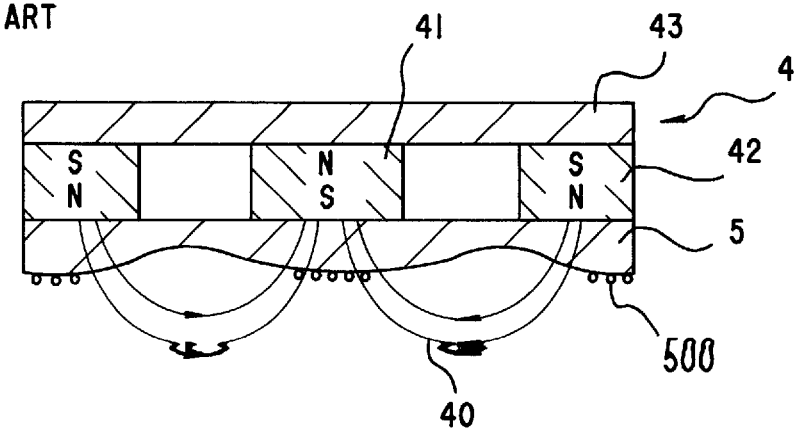
FIG. 7 is a schematic cross-sectional view for describing problems in conventional sputtering apparatuses.

Following is more detailed description using FIG. 4, 5 and 6 about formation of such dissimilar erosion profiles as in the above sputtering process. FIG. 3 is a detailed plane view of magnetic assembly 4 adopted in the sputtering apparatus shown in FIG. 1 and FIG. 2. FIG. 4 and FIG. 5 schematically shows loci of a point on magnetic assembly 4 when magnetic assembly 4 is rotated and revolved.

As shown in FIG. 3, magnetic assembly 4 is composed mainly of center magnet 41, outer magnet 42 surrounding center magnet 41, and yoke 43 interconnecting center magnet 41 and outer magnet 42 by fixing them at its front surface. Center magnet 41 is a short- column-shaped component which plane view is a trapezoid. Outer magnet 42 has a ring shape which is almost rectangular and swells a little at both sides. And, the surface of center magnet 41 is N pole and the surface of outer magnet 42 is S pole. This is why arch shaped magnetic lines are applied from center magnet 42 to outer magnet 41. As understood easily, the inverse combination of poles, i.e., S pole center magnet 42 and N pole outer magnet 42, is also effective. The point designated by "81A" in FIG. 3 is the center of magnetic assembly 4 and corresponds to the rotation axis of magnetic assembly 4. The point designated by "82A" in FIG. 3 is the center of the target 5 and corresponds to the revolution axis.

Now, it will be investigated how loci random points on magnetic assembly 4 would draw, when magnetic assembly 4 is rotated and revolved. In this investigation, point "a" on the periphery of magnetic assembly 4 and point "P" near the rotation axis 81A on magnetic assembly 4 are taken as examples. Loci drawn by these points are shown in FIG. 4 and FIG. 5. FIG. 4 shows loci of point "a". FIG. 5 shows loci of point "P".

FIG. 4 (a) shows the locus of point "a" when EDV mechanism is not operated, that is, the eccentric distance is constant. FIG. 4 (b) and FIG. 4 (c) shows loci of point "a" when the eccentric distance is varied. In FIG. 4 (a), FIG. 4 (b) and FIG. 4 (c), "a1", "a2" and "a3" designate loci of point "a", and, "L1", "L2" and "L3" designate loci of rotation axis 81A. The origin of point "a" is shifted counterclockwise with 90 degree, compared with FIG. 3. Clearly shown in FIG. 4 (b) and FIG. 4 (c), when the eccentric distance is varied, point "a" moves on a pattern different from that when the eccentric distance is constant. Therefore, the magnetic field applied by magnetic assembly 4 is also rotated and revolved with a different pattern.

FIG. 5 (a)–FIG. 5 (b) show loci of point "P" in each eccentric distance L. FIG. 5 (a) shows the locus of "P1" when magnetic assembly 4 is rotated and revolved with the constant maximum eccentric distance ($L=L_{max}$). FIG. 5 (b) shows the locus of point "P" when the eccentric distance is constant and half of the maximum eccentric distance ($L=L_{max}/2$). FIG. 5 (c) shows the locus of point "P" when the eccentric distance is varied from the maximum to half of the maximum ($L=L_{max}\sim L_{max}/2$). FIG. 5 (d) shows the locus of point "P" when the eccentric distance is varied with a pattern different from FIG. 5 (c) ($L=L_1\sim L_1/2$). FIG. 5 (e) shows the locus of point "P" when the eccentric distance is zero (L=0), i.e., rotation axis 81A corresponds to revolution axis 82A. As shown in FIG. 5(a)–5(e), point "P" on magnetic assembly 4 draws much various loci by varying the eccentric distance L and further by varying the variation pattern of the eccentric distance L.

As described, when the eccentric distance of rotation axis 81A to revolution axis 82A is varied much, points on magnetic assembly 4 draw much various loci. Therefore, the magnetic field by magnetic assembly 4 is also rotated and revolved with much various pattern. Varying patterns of the eccentric distance of rotation axis 81A to revolution axis 82A are given randomly by choosing adequately the rotation speed of rotation driving source 814, the revolution speed of revolution driving source 824 and EDV driving source 834. Therefore, it is preferable that after calculating a desirable pattern of rotation revolution motion of the magnetic field, which depends on a desirable erosion profile, control commands are sent from control unit 80 to each driving source 814, 824, 834 so that the calculated desirable pattern can be obtained.

By carrying out such a control as that, an optimum erosion profile is always formed on target 5 even if a discharge gas is switched to a dissimilar gas, because a rotated revolved magnetic field of an optimum pattern for the dissimilar gas is applied on target 5. Therefore, reaction product is restrained from precipitating on a shallowly eroded area of target 5. This is why the problems such as the dust particle generation and the productivity decrease coming from interposing the sputter cleaning are solved effectively.

In the composition of the mode as described, though rotation means 81 and revolution means 82 are directly connected through the gear engagements, they may be connected by a motion transferring means such as a belt. Though EDV mechanism is the mechanism which rotates rotation means 81 and revolution means 82 in a body, a mechanism to move linearly or to revolve rotation means 81 against fixed revolution means 82 may be also employed as EDV mechanism 83.

Placement of rotation and revolution system 8 outside vacuum chamber 1 contributes to prevention of dust generation in vacuum chamber 1 because mechanisms which are easy to release dust are outside vacuum chamber 1. Therefore, the apparatus of the mode has the advantage that substrate 30 is effectively prevented from contamination.

The sputtering apparatus of the invention can be used for various kinds of deposition other than titanium nitride film deposition. And, the invention is not limited to a case that two or more kinds of discharge gases are switched to be introduced, and is also applicable to a case that only one kind of discharge gases is introduced. Varying an eccentric distance of a rotation axis to a revolution axis enables magnetic field distribution to be changed so freely, which brings the high advantage of the invention, that is, choice of an optimum erosion profile.

What is claimed is:

1. A magnet assembly rotation system for a sputtering apparatus for depositing a thin film on a substrate surface in a vacuum chamber, comprising:

a rotation means for rotating a magnetic assembly in a cathode, a revolution means for revolving said magnetic assembly around a revolution axis which corresponds to a center axis of a target composing said cathode, an eccentric distance varying means for varying an eccentric-distance, which is a distance between said rotation axis of said rotation means and a revolution axis of said revolution means.

2. The magnetic assembly rotation system as claimed in claim 1, where said eccentric-distance varying means is a mechanism to revolve said rotation means and said revolution means in a body around an axis which is different from both said rotation axis and said revolution axis.

3. The magnetic assembly rotation system claimed in claim 1, said magnetic assembly rotation system is provided outside said vacuum chamber.

4. A magnet assembly rotation system for a sputtering apparatus to deposit a thin film on a substrate in a vacuum chamber, comprising:

a magnetic assembly;

a first motor to rotate said magnetic assembly in a cathode around a rotation axis;

a second motor to rotate said magnetic assembly around a revolution axis which corresponds to a center axis of a target composing said cathode;

a third motor to rotate said rotation axis around another axis, which is different from both said rotation axis and said revolution axis, to vary a distance between said rotation axis and said revolution axis.

5. The sputtering apparatus claimed in claim 4, said magnetic assembly rotation system is provided outside said vacuum chamber.

* * * * *